United States Patent
Shimoda et al.

(10) Patent No.: US 11,096,280 B2
(45) Date of Patent: Aug. 17, 2021

(54) RELAY

(71) Applicant: Omron Corporation, Kyoto (JP)

(72) Inventors: Daichi Shimoda, Saga (JP); Kazumune Kishikawa, Takeo (JP); Yasuyuki Kitahara, Yamaga (JP); Tomonori Shiraishi, Saga (JP); Shigeyuki Maeda, Saga (JP); Yuta Fujise, Takeo (JP); Seiki Shimoda, Yamaga (JP)

(73) Assignee: Omron Corporation, Kyoto (JP)

( * ) Notice: Subject to any disclaimer, the term of this patent is extended or adjusted under 35 U.S.C. 154(b) by 4 days.

(21) Appl. No.: 16/605,739

(22) PCT Filed: May 17, 2018

(86) PCT No.: PCT/JP2018/019126
§ 371 (c)(1),
(2) Date: Oct. 16, 2019

(87) PCT Pub. No.: WO2019/003697
PCT Pub. Date: Jan. 3, 2019

(65) Prior Publication Data
US 2021/0127488 A1    Apr. 29, 2021

(30) Foreign Application Priority Data
Jun. 30, 2017   (JP) .............................. JP2017-129011

(51) Int. Cl.
*H05K 5/00*    (2006.01)
*H05K 1/11*    (2006.01)
(Continued)

(52) U.S. Cl.
CPC .......... *H05K 1/117* (2013.01); *H05K 1/0284* (2013.01); *H05K 1/181* (2013.01); *H05K 5/0069* (2013.01);
(Continued)

(58) Field of Classification Search
USPC ........................................................ 361/752
See application file for complete search history.

(56) References Cited

U.S. PATENT DOCUMENTS 5,844,781 A  * 12/1998 Schlotterer ............ H05K 5/062
                                                         361/752
2017/0076893 A1* 3/2017 Tsutsui ................. H01H 50/041

FOREIGN PATENT DOCUMENTS

JP   S58-164160 U   11/1983
JP   S61-166359 U   10/1986
(Continued)

OTHER PUBLICATIONS

International Search Report issued in PCT/JP2018/019126 dated Aug. 7, 2018 (2 pages).
(Continued)

*Primary Examiner* — Andargie M Aychillhum
(74) *Attorney, Agent, or Firm* — Osha Bergman Watanabe & Burton LLP

(57) ABSTRACT

A relay includes a relay main body (10) including a base (20) having a first surface (21), and a relay substrate (30) extending, in a direction intersecting the first surface (21), from a second surface (22) on the opposite side of the base (20) from the first surface (21), the relay substrate (30) being united with the base (20), and a case (50) attached to the relay main body (10) to cover the relay substrate (30), and the case (50) being filled with sealant. The relay main body (10) includes a board connector (23) provided on the first surface (21) of the base (20), an electronic component mounting portion (33) provided on the relay substrate (30), a conducting portion (40) provided on respective surfaces of the base (20) and the relay substrate (30), and an electronic component (34) mounted on the electronic component mounting portion (33).

6 Claims, 8 Drawing Sheets

(51) Int. Cl.
*H05K 1/02* (2006.01)
*H05K 1/18* (2006.01)
*H05K 5/06* (2006.01)

(52) U.S. Cl.
CPC ... *H05K 5/064* (2013.01); *H05K 2201/09027* (2013.01); *H05K 2201/09181* (2013.01); *H05K 2201/09409* (2013.01); *H05K 2201/09472* (2013.01); *H05K 2201/09754* (2013.01); *H05K 2201/10053* (2013.01)

(56) References Cited

FOREIGN PATENT DOCUMENTS

| | | |
|---|---|---|
| JP | H02-8065 U | 1/1990 |
| JP | H04-113474 U | 10/1992 |
| JP | H10-154885 A | 6/1998 |
| JP | 2004-087964 A | 3/2004 |

OTHER PUBLICATIONS

Written Opinion of the International Searching Authority issued in PCT/JP2018/019126 dated Aug. 7, 2018 (10 pages).

\* cited by examiner

RELAY

TECHNICAL FIELD

The present invention relates to a relay such as a solid state relay.

BACKGROUND ART

Patent Document 1 discloses a surface mount type solid state relay. This solid state relay includes an internal printed board on which an electronic component is mounted, two lead terminals that extend from the internal printed board to the outside of a housing to be connected to a printed board outside the housing, and the housing molded to the internal printed board. In such a solid state relay, the internal printed board extends parallel to the printed board.

PRIOR ART DOCUMENTS

Patent Documents

Patent Document 1: Japanese Utility Model Publication No. H02-008065

SUMMARY OF THE INVENTION

Problems to be Solved by the Invention

In the solid state relay, however, the two lead terminals extend, along the printed board in opposite directions, from both end portions in the extending direction of the internal printed board, which makes a mounting area occupied by the solid state relay mounted on the printed board larger and in turn makes it difficult to downsize the printed board.

It is therefore an object of the present invention to provide a relay that allows a circuit board to be downsized.

Means for Solving the Problem

A relay according to an aspect of the present invention includes:
 a relay main body including a base having a first surface facing a circuit board, and a relay substrate extending, in a direction intersecting the first surface, from a second surface on an opposite side of the base from the first surface in the direction intersecting the first surface, the base and the relay substrate being united with each other; and
 a case having a hollow box shape with one opened surface and attached to the relay main body with an end portion of the opened surface facing the base to cover the relay substrate, the case being filled with sealant. In such a relay, the relay main body includes:
 a board connector provided on the first surface of the base and configured to connect to the circuit board,
 an electronic component mounting portion provided on the relay substrate,
 a conducting portion provided on respective surfaces of the base and the relay substrate to electrically connect the board connector and the electronic component mounting portion, and
 an electronic component mounted on the electronic component mounting portion.

Effect of the Invention

The relay according to the aspect includes the relay main body including the base having the first surface on which the board connector configured to connect to the circuit board is provided, and the relay substrate that extends, in the direction intersecting the first surface, from the second surface on the opposite side of the base from the first surface and on which the electronic component is mounted, the base and the relay substrate being united with each other. This structure makes it possible to reduce, as compared with a relay including a relay main body extending parallel to the circuit board and lead terminals extending, in opposite directions, from both end positions in the extending direction of the relay main body, a mounting area occupied by the relay according to the aspect mounted on the circuit board by at least an area occupied the lead terminals to downsize the circuit board.

MODE FOR CARRYING OUT THE INVENTION

A description will be given below of embodiments of the present invention with reference to the accompanying drawings. In the following description, terms representing specific directions or positions (for example, terms including "up", "down", "right", "left", "end", and "side") are used as necessary, and note that these terms are used to facilitate understanding of the invention with reference to the drawings, and the technical scope of the present invention is not limited by the meanings of these terms. Further, the following description will be given by way of example only in nature and is not intended to limit the present invention, entities to which the present invention is applied, or uses of the entities. Furthermore, the drawings are schematic illustrations, and the ratios of dimensions and the like do not necessarily match the actual ratios.

Figure 1:
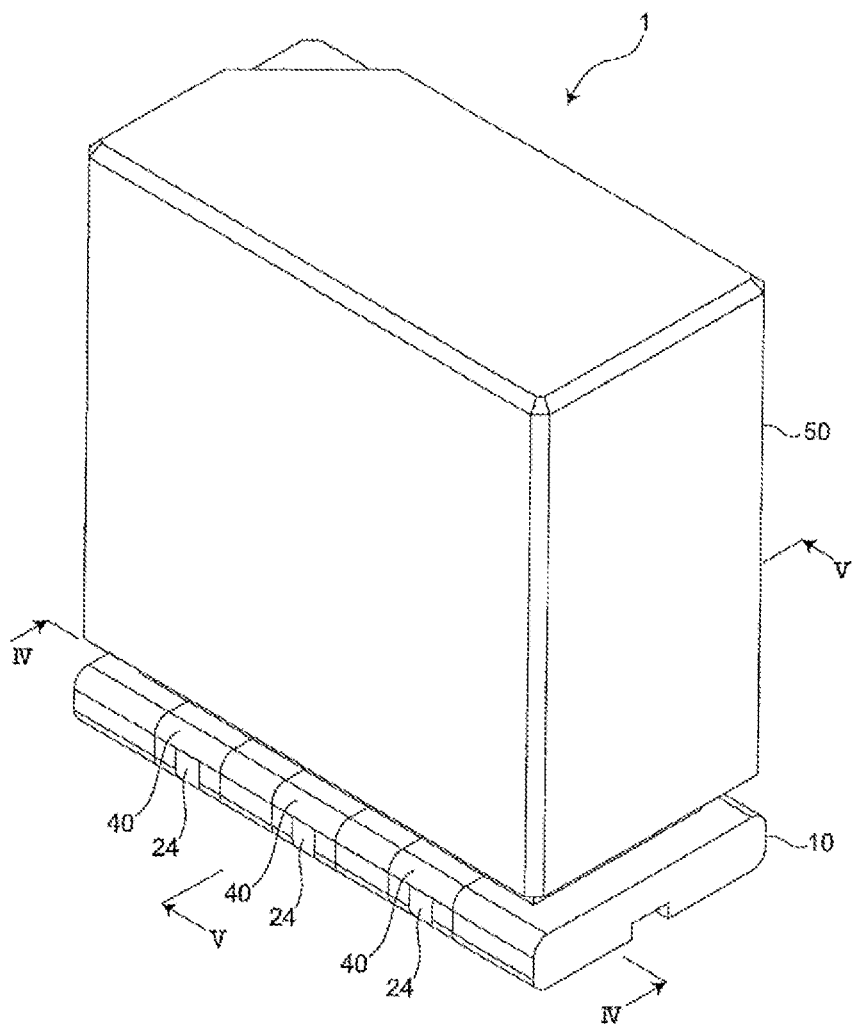
FIG. 1 is a perspective view of a relay according to an embodiment of the present invention.

As shown in FIG. 1, a relay 1 according to an embodiment of the present invention includes a relay main body 10 and a case 50 that covers the relay main body 10.

Figure 2:
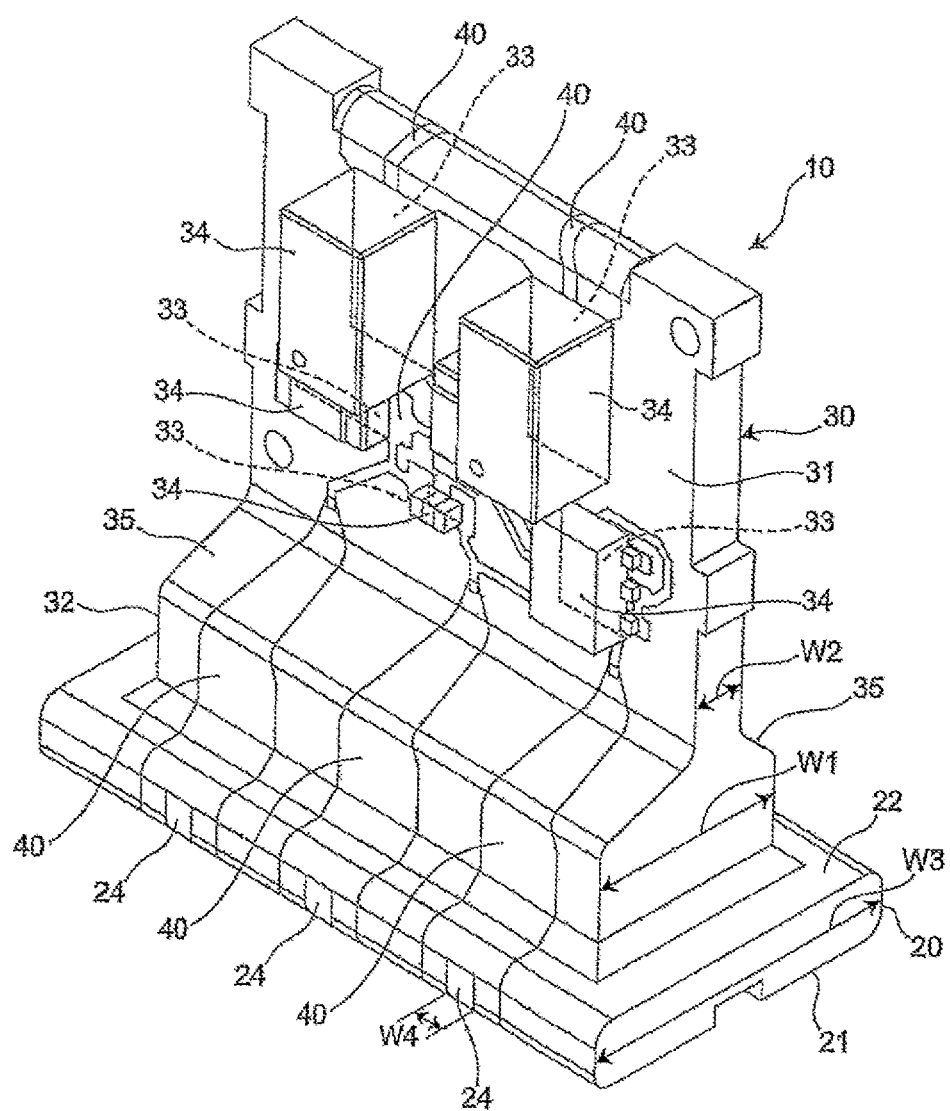
FIG. 2 is a perspective view of the relay shown in FIG. 1 with a case removed.

As shown in FIG. 2, the relay main body 10 includes a base 20 having a substantially rectangular plate shape and a relay substrate 30 having a substantially rectangular plate shape extending from a plate surface of the base 20 in a direction intersecting (for example, orthogonal to) the plate surface of the base 20. The base 20 and the relay substrate 30 are united with each other by resin molding and have a substantially T shape when viewed in a longitudinal direction of the base 20.

Figure 3:
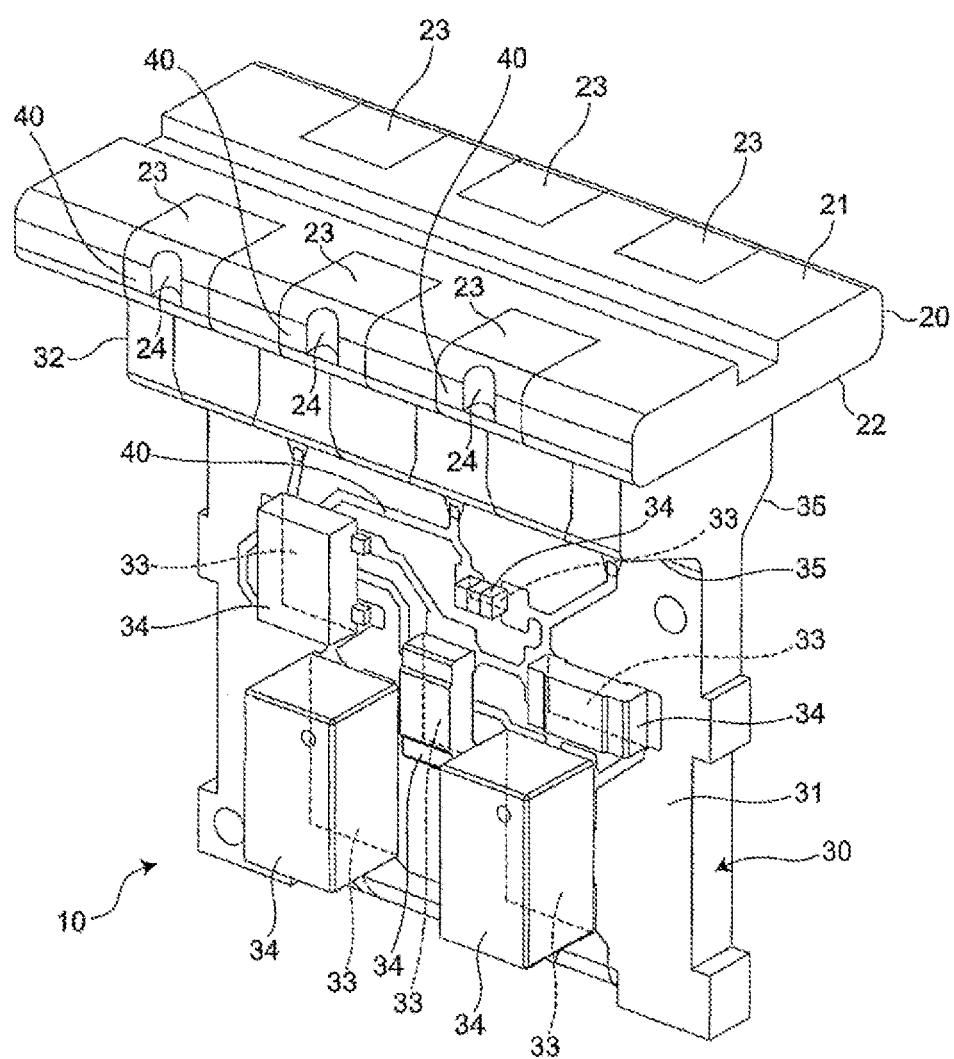
FIG. 3 is a perspective view of the relay shown in FIG. 1 viewed in a direction different from a direction of FIG. 2.

As shown in FIG. 2 and FIG. 3, the base 20 includes a first surface 21 that is a substantially rectangular plate surface facing a circuit board, and a second surface 22 that is a substantially rectangular plate surface on an opposite side of the base 20 from the first surface 21 in a direction intersecting the first surface 21 (that is, an up-down direction in FIG. 2 and FIG. 3). The first surface 21 is provided with a board connector 23 that is conductive and is configured to connect to a connecting terminal of the circuit board. According to the embodiment, a total of six board connectors 23 are arranged separately from each other, three on each side extending in the longitudinal direction of the first surface 21. Note that the base 20 except for the board connectors 23 is made of, for example, an insulating resin.

As shown in FIG. 2, the relay substrate 30 extends from the second surface 22 of the base 20 in the direction intersecting the first surface 21, and a plate surface of the relay substrate 30 is disposed intersecting a short direction of the base 20. The relay substrate 30 includes a plate portion 31, and an assembly guide 32 connected to an end portion of the plate portion 31 adjacent to the base 20 and the second surface 22 of the base 20.

The plate portion 31 includes, on its plate surface, an electronic component mounting portion 33 that is conductive and an electronic component 34 mounted on the electronic component mounting portion 33. The plate portion 31 except for the electronic component mounting portion 33 and the electronic component 34 is made of, for example, an insulating resin.

The assembly guide 32 has a width W1 (shown in FIG. 2) in a thickness direction of the relay substrate 30 (that is, the short direction of the base 20) larger than a width W2 of the plate portion 31 (shown in FIG. 2) and smaller than a width W3 of the base 20 (shown in FIG. 2), and is configured to guide the relay substrate 30 to an assembly position in the case 50. Provided at ends of both plate surfaces of the assembly guide 32 adjacent to the plate portion 31 are inclined surfaces 35 that are getting closer to each other as a distance from the base 20 increases. Note that the assembly guide 32 is made of, for example, an insulating resin.

Further, as shown in FIG. 2 and FIG. 3, the relay main body 10 is provided with a conducting portion 40 that is conductive and is provided on respective surfaces of the base 20 and the relay substrate 30 to electrically connect the board connectors 23 of the base 20 to the electronic component mounting portion 33 of the relay substrate 30. The conducting portion 40 is formed by, for example, cream solder printing.

A recess 24 extending from the first surface 21 in the direction intersecting (for example, orthogonal to) the first surface 21 is provided on each conducting portion 40 on a side surface intersecting the first surface 21 of the base 20. The recess 24 has a length of, for example, less than 0.2 mm in the longitudinal direction of the base 20 (that is, a width W4 of the recess 24 shown in FIG. 2).

Figure 4:
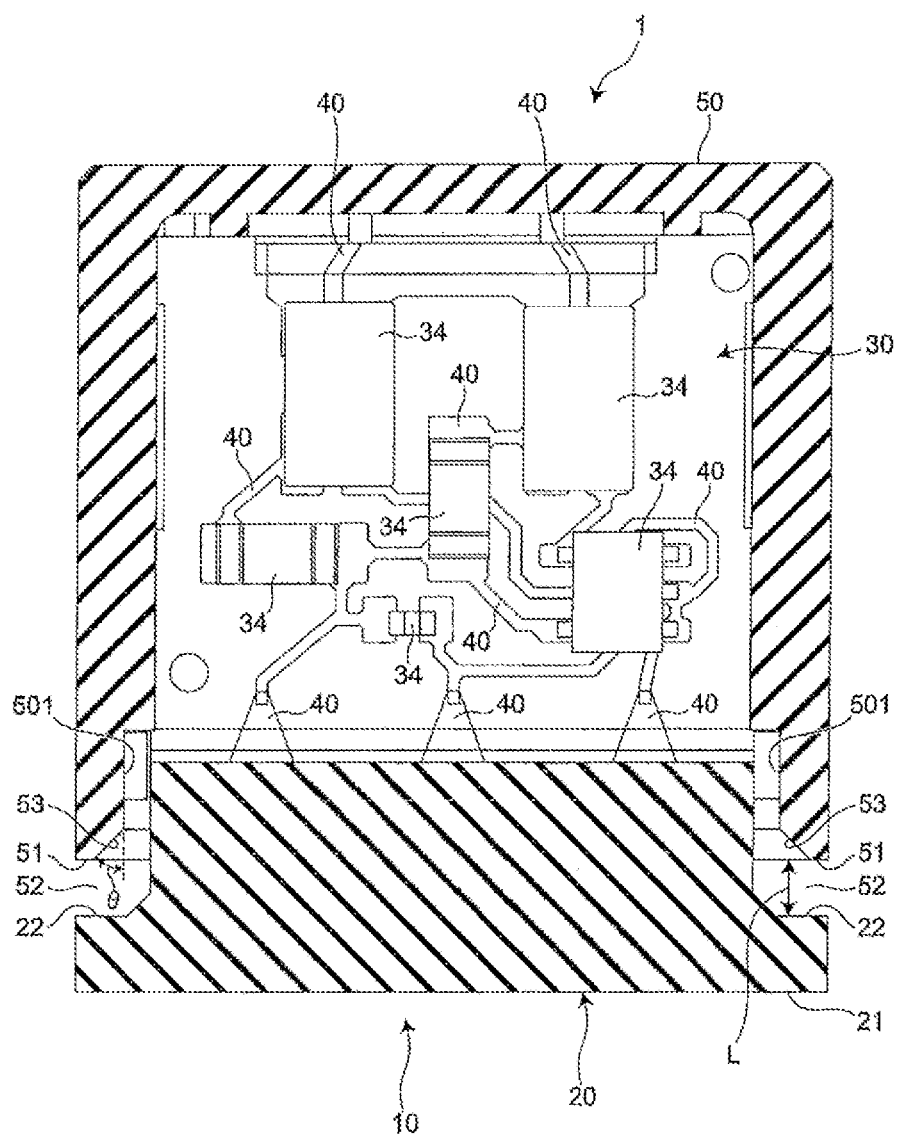
FIG. 4 is a cross-sectional view taken along line IV-IV in FIG. 1.

As shown in FIG. 4, the case 50 has a substantially rectangular parallelepiped hollow box shape with one opened surface, and is attached to the relay main body 10 with an end portion 51 on the opened surface side facing the second surface 22 of the base 20 to cover the relay substrate 30. The case 50 is filled with sealant (not shown). Note that the case 50 is made of, for example, an insulating resin.

A cleaning water drain gap 52 is provided between the end portion 51 on the opened surface side of the case 50 and the second surface 22 of the base 20. The cleaning water drain gap 52 is provided such that a shortest distance L between the second surface 22 of the base 20 and the end portion 51 on the opened surface side of the case 50 is equal to or greater than 0.3 mm.

Figure 5:
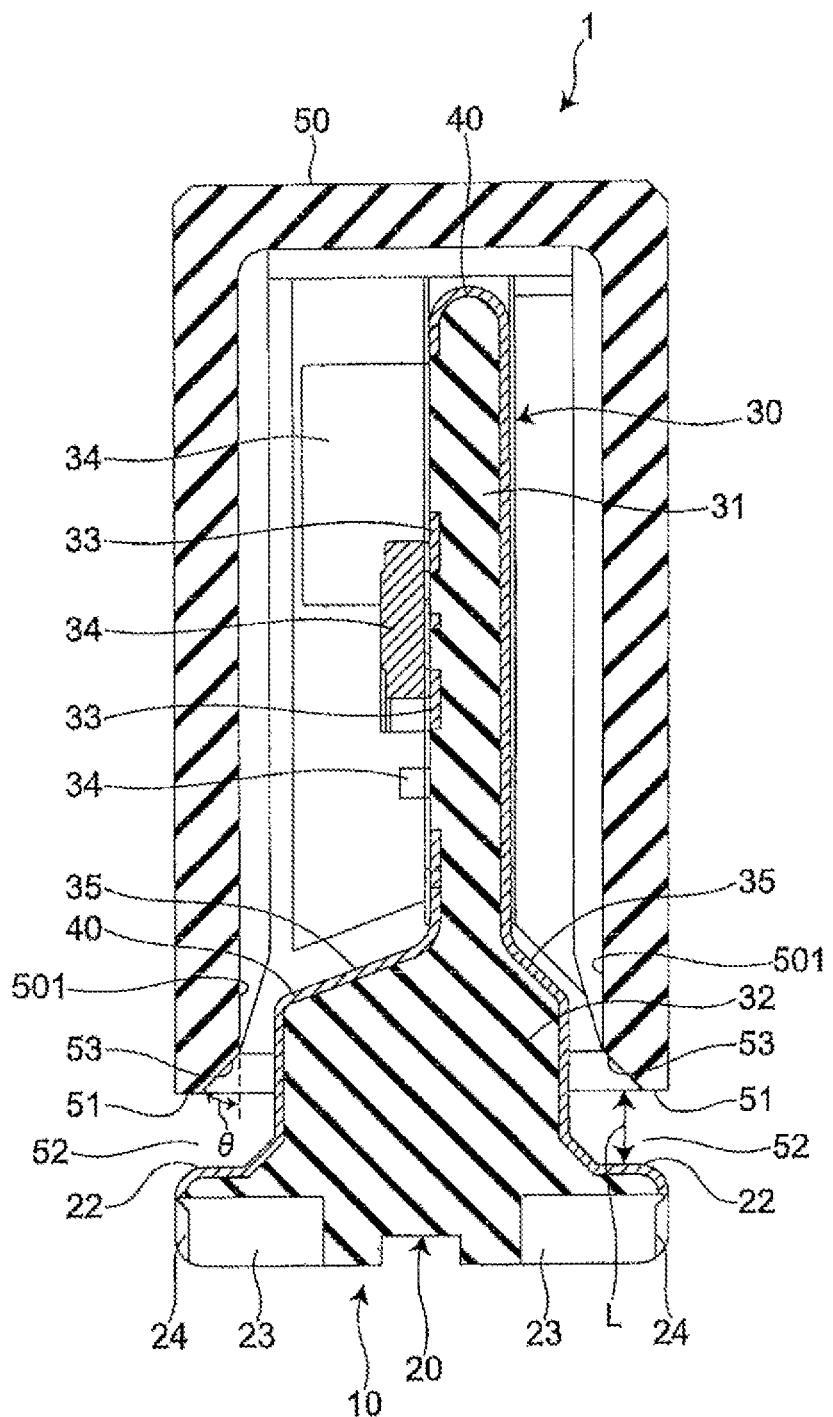
FIG. 5 is a cross-sectional view taken along line V-V in FIG. 1.

Further, an inclined surface 53 is provided on the end portion 51 on the opened surface side of the case 50 and on inner surfaces 501 of the case 50 facing each other. The inclined surface 53 is getting closer to the relay substrate 30 as a distance from the end portion 51 on the opened surface side of the case 50 in the direction intersecting the first surface 21 of the base 20 (that is, upward in FIG. 4 and FIG. 5) increases. The case 50 is filled with the sealant extending inward from the inclined surface 53.

Note that an inclination angle θ of the inclined surface 53 is preferably in a range from 35 to 55 degrees with respect to the inner surfaces 501 of the case 50, and the inclination angle θ is more preferably 45 degrees.

The relay 1 includes the relay main body 10 including the base 20 having the first surface 21 on which the board connector 23 configured to connect to the circuit board is provided, and the relay substrate 30 that extends, in the direction intersecting (for example, orthogonal to) the first surface 21, from the second surface 22 on the opposite side of the base 20 from the first surface 21 and on which the electronic component 34 is mounted, the base 20 and the relay substrate 30 being united with each other. This structure makes a mounting area with respect to the circuit board equal to an area of only the relay main body and thus makes it possible to reduce, as compared with a relay including a relay main body extending parallel to the circuit board and lead terminals extending, in opposite directions, from both end positions in the extending direction of the relay main body, a mounting area occupied by the relay mounted on the circuit board by at least an area occupied the lead terminals to downsize the circuit board.

Further, the relay substrate 30 includes the assembly guide 32 connected to the end portion of the plate portion 31 adjacent to the base 20 and the second surface 22 of the base 20 and having the width W1 in the thickness direction of the relay substrate 30 larger than the width W2 of the plate portion 31 and smaller than the width W3 of the base 20. When the relay substrate 30 is assembled to the case 50, the assembly guide 32 accurately guides the relay substrate 30 to the assembly position near a center in the short direction of the case 50 (that is, a left-right direction in FIG. 5) along the inclined surface 35, thereby making it possible to increase assembly accuracy of the relay 1.

Figure 6:
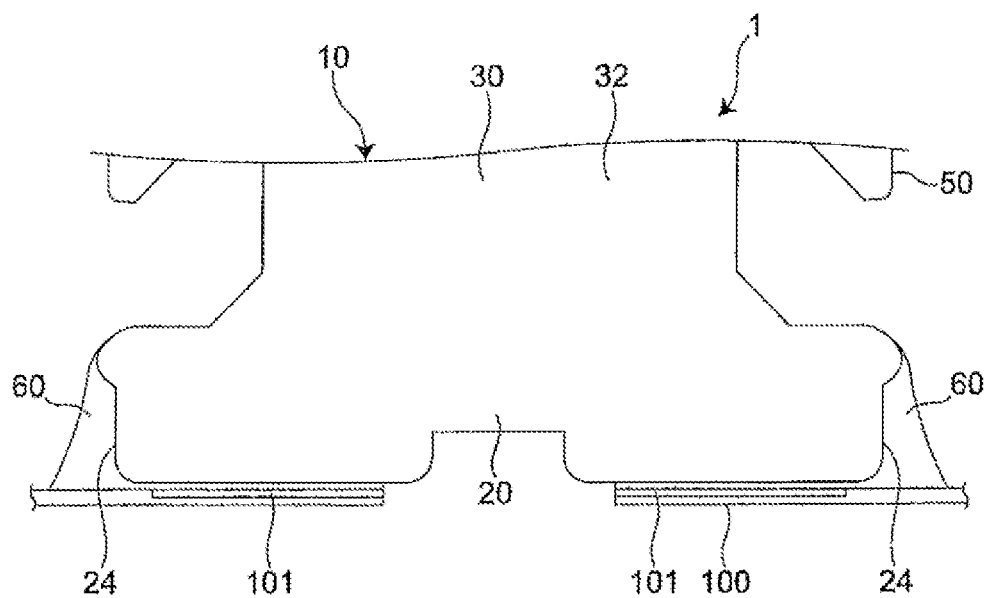
FIG. 6 is a schematic diagram showing a state where the relay shown in FIG. 1 is mounted on a circuit board.

Further, the recess 24 extending from the first surface 21 in the direction intersecting the first surface 21 is provided on the conducting portion 40 on the side surface intersecting the first surface 21 of the base 20. The recess 24 having, for example, a width W4 equal to or less than 0.5 mm (that allows capillary action of liquid solder) makes it possible to easily bring solder 60 on the circuit board 100 into the recess 24 on the conducting portion 40 with the help of capillary action when the relay 1 is mounted on the circuit board 100, as shown in FIG. 6, and in turn makes it possible to reliably form a solder fillet extending from the connecting terminal 101 on the circuit board 100 to the conducting portion 40. That is, this makes it possible to increase a soldering strength between the relay 1 and the circuit board 100.

Further, the cleaning water drain gap 52 is provided between the second surface 22 of the base 20 and the end portion 51 on the opened surface side of the case 50. Even when a substrate cleaning water temporarily adheres between the relay main body 10 and the case 50 during substrate cleaning, the adhering substrate cleaning water is smoothly drained from the cleaning water drain gap 52, thereby making it possible to increase drainage of the relay 1 and in turn making it possible to prevent any failure caused by water remaining in the relay 1 after substrate cleaning.

In the meantime, for example, when a narrow gap that allows capillary action is formed between the case 50 and the relay main body 10, the sealant filled in the case 50 tends to pass through the gap to flow out of the case 50. In the relay 1, the inclined surface 53 is provided on the end portion 51 on the opened surface side of the case 50 and on the inner surfaces 501 of the case 50 facing each other, the inclined surface 53 being getting closer to the relay substrate 30 as a distance from the end portion 51 on the opened surface side in the direction intersecting the first surface 21 of the base 20 increases. The inclined surface 53 widens a space between the case 50 and the relay main body 10, thereby suppressing the occurrence of capillary action and in turn making it possible to prevent the sealant filled in the case 50 from flowing out of the case 50.

Note that the inclined surface 53 may be provided on the end portion 51 on the opened surface side of the case 50 and on at least a pair of inner surfaces 501 of the case 50 facing each other.

Figure 7:
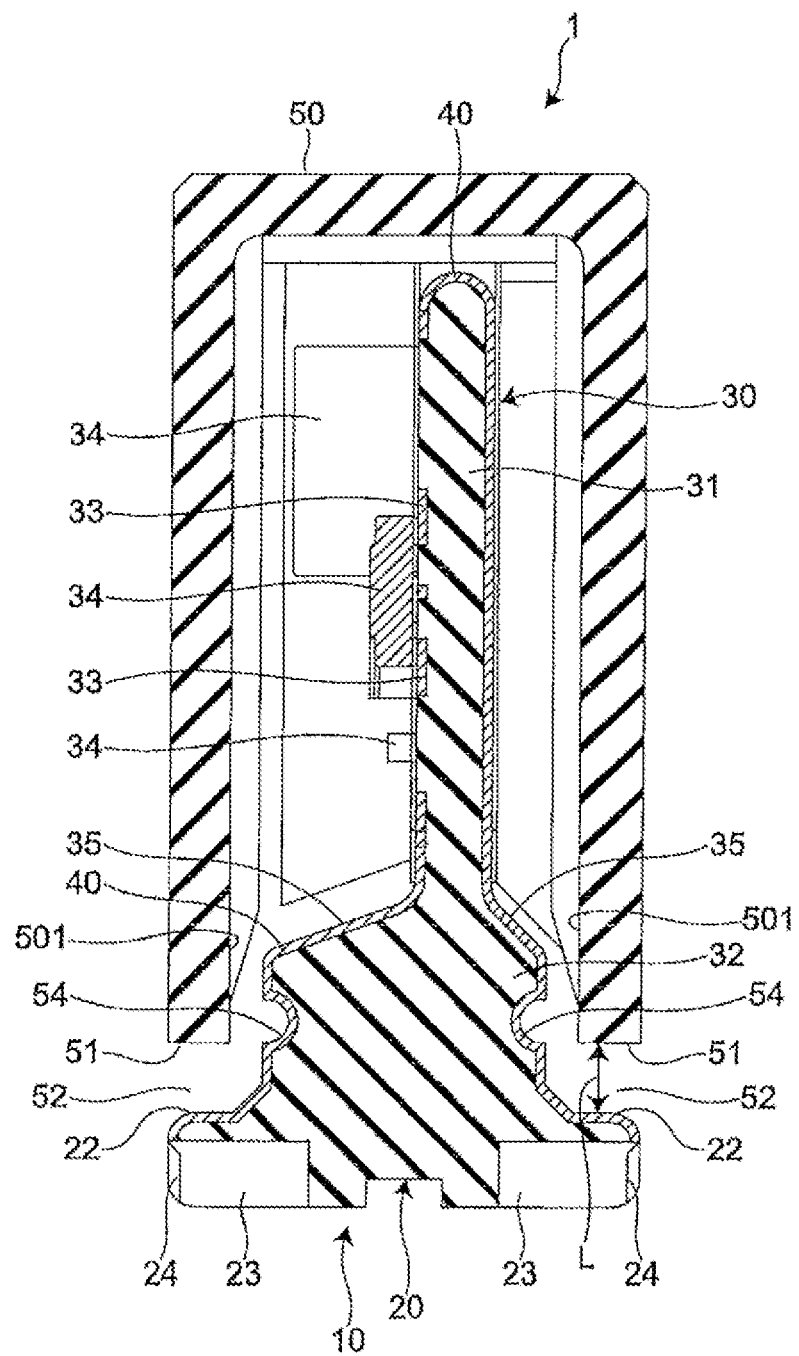
FIG. 7 is a cross-sectional view taken along line V-V in FIG. 1, showing a modification of the relay shown in FIG. 1.

Further, as shown in FIG. 7, even when a sealant outflow preventing groove portion 54 is provided on at least a pair of opposite surfaces of the relay substrate 30 facing the end portion 51 on the opened surface side of the case 50, it is possible to prevent the sealant filled in the case 50 from flowing out of the case 50.

Figure 8:
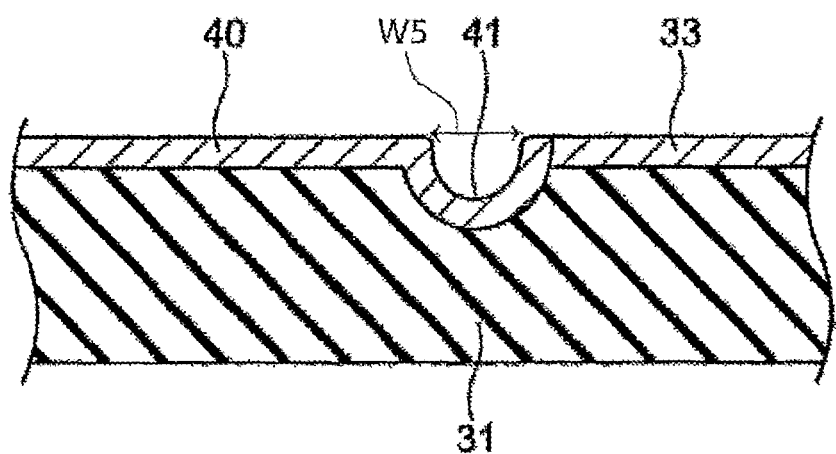
FIG. 8 is a schematic diagram for describing the modification of the relay shown in FIG. 1.

Further, as shown in FIG. 8, a solder leakage preventing groove portion 41 may be provided at an end portion of the conducting portion 40 adjacent to the electronic component mounting portion 33. The solder leakage preventing groove portion 41 has a groove width W5 of, for example, 0.2 mm. For example, even when solder resist is not applied (or cannot be applied) around the electronic component mounting portion 33 of the relay substrate 30, the solder leakage preventing groove portion 41 makes it possible to bring solder flowing out from the electronic component mounting portion 33 during mounting of the electronic component 34 into the solder leakage preventing groove portion 41 to prevent further outflow of the solder, thereby making it possible to prevent the solder from leaking from the electronic component mounting portion 33 during mounting of the electronic component 34.

One, a plurality, or all of the recess 24 of the base 20 of the relay main body 10, the assembly guide 32 of the relay substrate 30 of the relay main body 10, the inclined surface 53 of the case 50, and the cleaning water drain gap 52 between the base 20 and the case 50 may be omitted as appropriate.

The description has been given in detail of various embodiments according to the present invention with reference to the drawings, and, in conclusion, a description will be given of various aspects according to the present invention.

A switch according to a first aspect of the present invention includes:

a relay main body including a base having a first surface facing a circuit board, and a relay substrate extending, in a direction intersecting the first surface, from a second surface on an opposite side of the base from the first surface in the direction intersecting the first surface, the base and the relay substrate being united with each other; and a case having a hollow box shape with one opened surface and attached to the relay main body with an end portion on the opened surface side facing the base to cover the relay substrate, the case being filled with sealant. In such a switch, the relay main body includes:

a board connector provided on the first surface of the base and configured to connect to the circuit board, an electronic component mounting portion provided on the relay substrate, a conducting portion provided on respective surfaces of the base and the relay substrate to electrically connect the board connector and the electronic component mounting portion, and an electronic component mounted on the electronic component mounting portion.

The switch according to the first aspect makes it possible to reduce, as compared with a relay including a relay main body extending parallel to the circuit board and lead terminals extending, in opposite directions, from both end positions in the extending direction of the relay main body, a mounting area occupied by the switch mounted on the circuit board by at least an area occupied the lead terminals to downsize the circuit board.

In the switch according to a second aspect of the present invention, the relay substrate includes:

a plate portion provided with the electronic component mounting portion, and an assembly guide connected to an end portion of the plate portion adjacent to the base and the second surface of the base and having a width in a thickness direction of the relay substrate larger than a width of the plate portion and smaller than a width of the base, the assembly guide being configured to guide the relay substrate to an assembly position in the case.

The switch according to the second aspect allows, when the relay substrate is assembled to the case with the help of the assembly guide, the assembly guide to accurately guide the relay substrate to the assembly position in the case, thereby making it possible to increase assembly accuracy of the relay.

In the switch according to a third aspect of the present invention, a recess extending from the first surface in the direction intersecting the first surface is provided on the conducting portion on a side surface intersecting the first surface of the base.

In the switch according to the third aspect, for example, the recess having a width that allows capillary action of liquid solder makes it possible to easily bring the solder on the circuit board into the recess on the conducting portion with the help of capillary action when the relay is mounted on the circuit board and in turn makes it possible to reliably form a solder fillet extending from the connecting terminal on the circuit board to the conducting portion. That is, this makes it possible to increase a soldering strength between the relay and the circuit board.

In the switch according to a fourth aspect of the present invention, a cleaning water drain gap is provided between the second surface of the base and the end portion on the opened surface side of the case.

In the switch according to the fourth aspect, even when a substrate cleaning water temporarily adheres between the relay main body and the case during substrate cleaning, the adhering substrate cleaning water is smoothly drained from the cleaning water drain gap, thereby making it possible to increase drainage of the relay and in turn making it possible to prevent any failure caused by water remaining in the relay after substrate cleaning.

In the switch according to a fifth aspect of the present invention, the case has a rectangular parallelepiped shape, and an inclined surface is provided on the end portion on the opened surface side of the case and on at least a pair of inner surfaces of the case facing each other, the inclined surface being getting closer to the relay substrate as a distance from the end portion on the opened surface side in the direction intersecting the first surface increases.

The switch according to the fifth aspect makes it possible to prevent the sealant filled in the case from flowing out of the case.

In the switch according to a sixth aspect of the present invention, the relay substrate has a rectangular cross section taken along the first surface, and a sealant outflow preventing groove portion is provided on at least a pair of opposite surfaces of the relay substrate facing the end portion on the opened surface side of the case.

The switch according to the sixth aspect makes it possible to prevent the sealant filled in the case from flowing out of the case.

In the switch according to a seventh aspect of the present invention, a solder leakage preventing groove portion is provided at an end portion of the conducting portion adjacent to the electronic component mounting portion.

In the switch according to the seventh aspect, for example, even when solder resist is not applied (or cannot be applied) around the electronic component mounting portion of the relay substrate, the solder leakage preventing groove portion makes it possible to bring solder flowing out from the electronic component mounting portion during mounting of the electronic component into the solder leakage preventing groove portion to prevent further outflow of the solder, thereby making it possible to prevent the solder from leaking from the electronic component mounting portion during mounting of the electronic component.

Note that any suitable combination of embodiments or modifications out of the various embodiments or modifications can exhibit their respective effects. Further, a combination of the embodiments, a combination of the examples, or a combination of an embodiment and an example are possible, and a combination of features in different embodiments or examples are also possible.

INDUSTRIAL APPLICABILITY

The relay according to the present invention is applicable to, for example, a mechatronic integrated device (MID).

DESCRIPTION OF SYMBOLS 1 relay
10 relay main body
20 base
21 first surface
22 second surface
23 board connector
24 recess
30 relay substrate
31 plate portion
32 assembly guide
33 electronic component mounting portion
34 electronic component
35 inclined surface
40 conducting portion
41 solder leakage preventing groove portion
50 case
501 inner surface
51 end portion
52 cleaning water drain gap
53 inclined surface
60 solder
100 circuit board
101 connecting terminal

The invention claimed is:

1. A relay comprising:
a relay main body comprising a base comprising a first surface facing a circuit board, and a relay substrate extending, in a direction intersecting the first surface, from a second surface on an opposite side of the base from the first surface in the direction intersecting the first surface, the base and the relay substrate being united with each other; and
a case having a hollow box shape with one opened surface and attached to the relay main body with an end portion on the opened surface side facing the base to cover the relay substrate, the case being filled with sealant,
wherein the relay main body comprises:
a board connector provided on the first surface of the base and configured to connect to the circuit board,
an electronic component mounting portion provided on the relay substrate,
a conducting portion provided on respective surfaces of the base and the relay substrate to electrically connect the board connector and the electronic component mounting portion, and
an electronic component mounted on the electronic component mounting portion, and
wherein the relay substrate comprises:
a plate portion provided with the electronic component mounting portion, and
an assembly guide connected to an end portion of the plate portion adjacent to the base and the second surface of the base and having a width in a thickness direction of the relay substrate larger than a width of the plate portion and smaller than a width of the base, the assembly guide being configured to guide the relay substrate to an assembly position in the case.

2. The relay according to claim 1, wherein
a recess extending from the first surface in the direction intersecting the first surface is provided on the conducting portion on a side surface intersecting the first surface of the base.

3. The relay according to claim 1, wherein
a cleaning water drain gap is provided between the second surface of the base and the end portion on the opened surface side of the case.

4. The relay according to claim 1, wherein
the case has a rectangular parallelepiped shape, and an inclined surface is provided on the end portion on the opened surface side of the case and on at least a pair of inner surfaces of the case facing each other, the inclined surface being getting closer to the relay substrate as a distance from the end portion on the opened surface side in the direction intersecting the first surface increases.

5. The relay according to claim 1, wherein
the relay substrate has a rectangular cross section taken along the first surface, and
a sealant outflow preventing groove portion is provided on at least a pair of opposite surfaces of the relay substrate facing the end portion on the opened surface side of the case.

6. The relay according to claim 1, wherein
a solder leakage preventing groove portion is provided at an end portion of the conducting portion adjacent to the electronic component mounting portion.

* * * * *